United States Patent
Go et al.

(10) Patent No.: US 6,812,563 B2
(45) Date of Patent: Nov. 2, 2004

(54) MICROCOOLING DEVICE

(75) Inventors: Jeung-sang Go, Kyungki-do (KR); Tae-gyun Kim, Kyungki-do (KR); Kyung-il Cho, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 35 days.

(21) Appl. No.: 10/198,133

(22) Filed: Jul. 19, 2002

(65) Prior Publication Data

US 2003/0015790 A1 Jan. 23, 2003

(30) Foreign Application Priority Data

Jul. 19, 2001 (KR) ......................................... 2001-43504

(51) Int. Cl.[7] ............................................. H01L 23/34
(52) U.S. Cl. ........................ 257/715; 257/721; 257/714; 257/930; 257/712
(58) Field of Search ................................ 257/714, 715, 257/721, 930, 678, 701, 704, 712, 797, 706, 690, 692, 693, 697

(56) References Cited

U.S. PATENT DOCUMENTS

| | | | |
|---|---|---|---|
| 5,727,618 A | | 3/1998 | Mundinger et al. |
| 5,998,240 A | * | 12/1999 | Hamilton et al. ............ 438/122 |
| 6,129,145 A | * | 10/2000 | Yamamoto et al. ......... 165/168 |
| 6,388,317 B1 | * | 5/2002 | Reese .......................... 257/713 |
| 6,437,437 B1 | * | 8/2002 | Zuo et al. .................... 257/710 |
| 6,437,981 B1 | * | 8/2002 | Newton et al. ............. 361/700 |
| 6,521,516 B2 | * | 2/2003 | Monzon et al. ............. 438/514 |
| 6,582,987 B2 | * | 6/2003 | Jun et al. ...................... 438/49 |

\* cited by examiner

Primary Examiner—Nathan J. Flynn
Assistant Examiner—Pershelle Greene
(74) Attorney, Agent, or Firm—Burns, Doane, Swecker & Mathis, L.L.P.

(57) ABSTRACT

A microcooling device is provided. The microcooling device includes a substrate, a microchannel array, and a condenser. A predetermined region of a lower surface of the substrate contacts a heat source. The microchannel array is placed on the substrate so that a coolant concentrating portion is opposite to the predetermined region of the lower surface. The condenser fixes the microchannel array, condenses vapor generated in a process of cooling the heat source, and allows the condensed vapor to flow into the microchannel array.

17 Claims, 6 Drawing Sheets

MICROCOOLING DEVICE

Priority is claimed to Patent Application Number 2001-43504 filed in Republic of Korea on Jul. 19, 2001, herein incorporated by reference.

BACKGROUND OF THE INVENTION

1. Field of the Invention

The present invention relates to a microcooling device, and more particularly, to a microcooling device having a microchannel array which allows a coolant to flow into a heat generator by a capillary force.

2. Description of the Related Art

General semiconductor devices have several volts of operating voltages. However, a semiconductor device does not utilize the whole of electric energy being supplied, but discharges a portion of the electric energy in the form of heat because of resistances of materials of several components constituting the semiconductor device.

Heat may sharply deteriorate the performance of a semiconductor device and damage the semiconductor so that the semiconductor itself or important parts constituting the semiconductor device are not restored if serious. Thus, one of elements of prolonging reliability and lifespan of an electronic device is to effectively remove heat inevitably generated during its operation.

Various cooling devices are adopted to remove heat generated in chips or electronic devices. For example, in a case of a computer, an air-cooling device, which flows external air thereinto, circulates it around, and cools it using a fan, is generally used to remove heat generated from built-in semiconductor chips. A water-cooling method is more preferable than an air-cooling method in consideration of cooling efficiency of coolant. However, in the water-cooling method, a short circuit may occur due to a water leakage and an additional device such as a condenser or the like, is necessary. Thus, the water-cooling method is limitedly used.

Nevertheless, as the amount of heat generation increases in an electronic device, an attempt to cool the electronic device by the water-cooling method has bee made because of cooling limitation of the air-cooling method. In particular, chip unit cooling has been attempted. However, heat (heat fluid) per unit area generated in a chip region is almost equal to heat fluid per unit area generated in a rocket engine. Thus, microcooling devices using microchannels with high heat conductivity for effective circulation and phase shift have been manufactured to reduce heat generated in the chip region.

FIG. 1 is a perspective view of a microchannel included in a heat exchanger according to the prior art (U.S. Pat. No. 5,727,618). Referring to FIG. 1, Reference numeral 25 is copper sheets. A solid sheet 60 is placed on the copper sheets 25. The upper surface of the solid sheet 60 contacts a heat generator (not shown). Thus, heat of the heat generator is transmitted to the copper sheets 25 through the solid sheet 60. The copper sheets 25 have been etched with rows of holes 40 that pierce the sheets. The copper sheets 25 have been coated with a thin layer of sliver (not shown), aligned and fused together so that the aligned holes 40 form an array of microchannels 165.

A manifold section 170 formed from a stack of etched copper plates is juxtaposed to the first section with the stack of the copper sheets 25. A first copper plate 65 of the manifold 170 adjoining the microchannel array 165 has a plurality of elongated apertures 70 oriented transversely to and in fluid communication with the microchannels 165. A shaft 135 containing coaxial inlet and outlet conduits 180 and 190 provides fluid to and receives fluid from the manifold stack 170. The series of plates of the manifold 170 form apertures which transform fluid flow from the single inlet conduit 180 to alternately spaced elongated inlet apertures 72 of plates 65, and transform fluid flow back from other alternatively spaced elongated outlet apertures 73 of plate 65 to the single outlet conduit 190.

The single shaft 135 having coaxial inlet and outlet conduits plugs into a modular hole in a case having a fluid supply and drain and a plurality of such holes for fitting a plurality of such shafts. The alternatively spaced inlet apertures 72 and outlet apertures 73 adjoining the microchannel array 165 lower the pressure required to cause fluid to flow through the microchannel 165. The microchannels 165 are formed in a very thermally conductive substrate of copper with small dimensions and large height-to-width aspect ratios.

As described above, the microchannel of the heat exchanger according to the prior art provides fluid which has flowed into through the inlet conduit 180 to the solid sheet 60 adjoining the heat generator through the elongated inlet apertures 72 formed in the manifold 170 and the holes 40 formed in the copper sheets 25, and discharges fluid which has absorbed heat of the heat generator via the outlet conduit 190 through the holes 40 and the outlet apertures 73.

In cooling using such a compulsorily circulating method, the inlet and outlet apertures 72 and 73 adjoining the microchannel array 165 drops pressure. Thus, an additional high-pressure tank or pump is necessary to circulate fluid by overcoming the drop in pressure. Also, microchannels are fouled by dust, other impurities, or the like.

SUMMARY OF THE INVENTION

To solve the above-described problems, it is an object of the present invention to provide a microcooling device which can be made small and thin with excellent cooling efficient and a simple structure, does not require an additional device for circulating coolant, and reduce the unit cost of a microchannel array.

Accordingly, to achieve the above object, there is provided a microcooling device including a substrate, a microchannel array, and a condenser. A predetermined region of a lower surface of the substrate contacts a heat source. The microchannel array is placed on the substrate so that a coolant concentrating portion is opposite to the predetermined region of the lower surface. The condenser fixes the microchannel array, condenses vapor generated in a process of cooling the heat source, and allows the condensed vapor to flow into the microchannel array.

Here, the microchannel array includes at least one unit where a capillary force for allowing the coolant to flow into the coolant concentrating portion is generated. The microchannel array includes at least two or more units, any one of which has the same shape as or different shape from the other ones.

The unit includes a frame and a plurality of pins which are connected to the frame so as to be oriented toward the coolant concentrating portion. Here, portions of the plurality of pins are shorter than the others, and distances between the pins are narrow enough to generate capillary forces, preferably, get narrower as being oriented toward the coolant concentrating portion. However, the distances between the pins may be uniform. Also, it is preferable that the pins are linear, but may be non-linear.

The condenser includes a cap and a heat sink. The cap covers the microchannel array and is hermetically sealed at the edge of the substrate around the cap, and the inside thereof contacts the vapor so as to absorb latent heat of the vapor. The heat sink is placed on the cap and absorbs heat transmitted to the cap so as to maintain a temperature of the cap to a predetermined temperature enough to condense the vapor.

Using a microcooling device according to the present invention, a coolant can naturally be circulated without pumping equipment. Thus, since the configuration of the microcooling device is simple and components of the microcooling device are flat plates, it is possible to make the microcooling device small and thin. Also, since it is simple to manufacture units constituting a microchannel array, unit costs can be reduced. Further, it is possible to stack the units so as to have a very wide surface area. Thus, the maximum heat transfer efficiency can be increased.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Figure 1:
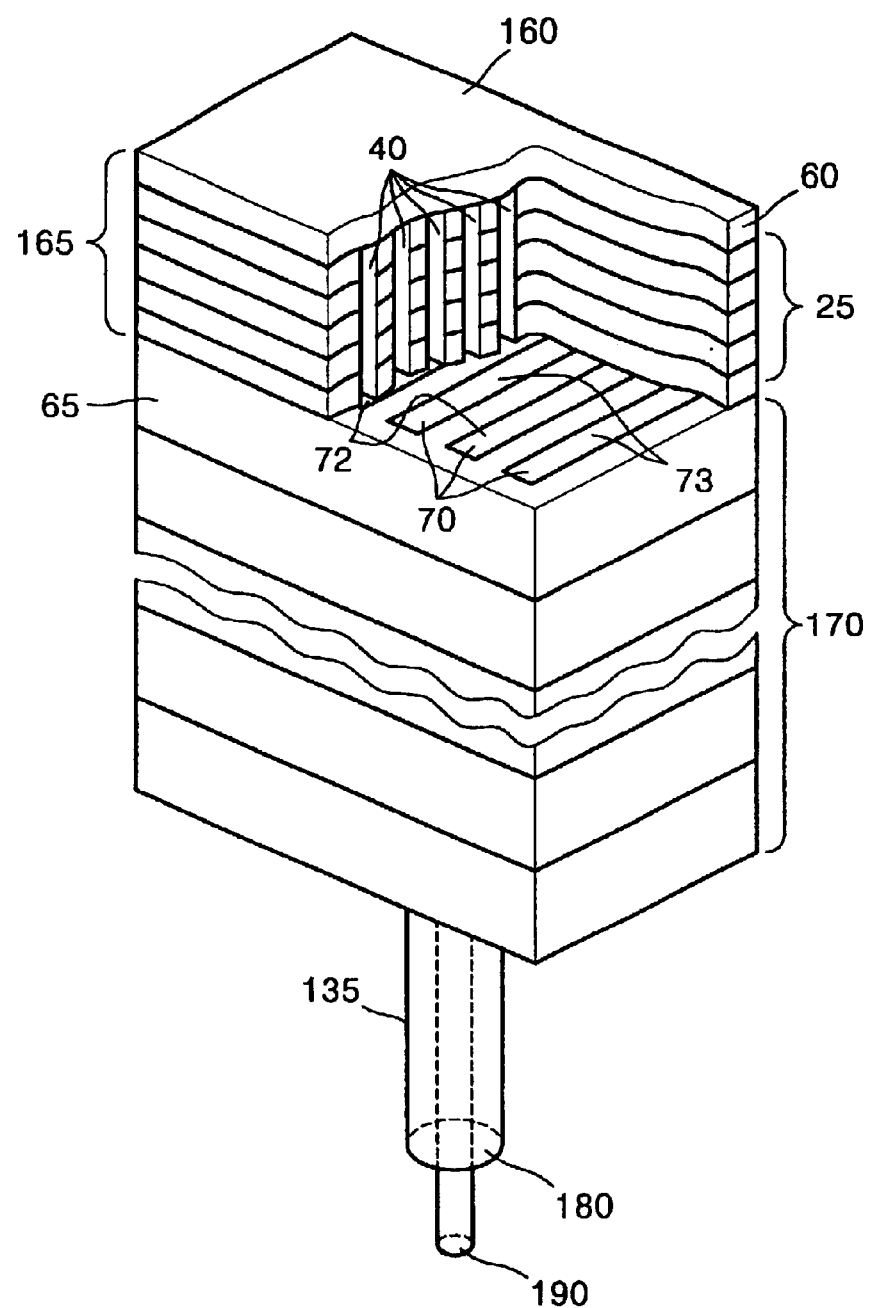
FIG. 1 is a perspective view of microchannels of a heat exchanger according to the prior art.

Hereinafter, a vaporizer of a heat exchanger according to an embodiment of the present invention will be described in detail with reference to the attached drawings. In the drawings, the thicknesses of layers or regions are exaggerated for clarity.

A unit constituting a microchannel array included in the vaporizer of the heat exchanger according to the embodiment of the present invention will first described.

Figure 2:
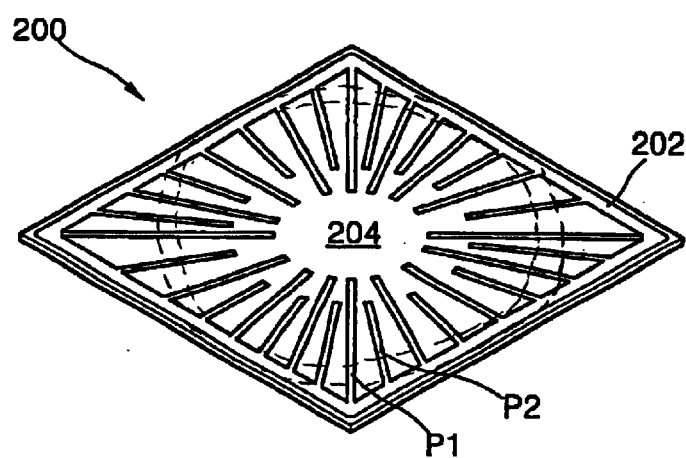
FIG. 2 is a perspective view of a unit constituting a microchannel array included in a microcooling device according to an embodiment of the present invention.

Referring to FIG. 2, it can be seen that a unit 200 is square. The unit 200 includes a frame 202, a coolant concentrating portion 204, and a plurality of pins P1 and P2 oriented toward the coolant concentrating portion 204. First pins P1 of the pins P1 and P2 are longer than second pins P2. A portion of the pins P1 and P2 arrives to the cooling coolant concentrating portion 204, but the others do not. Long pins and short pins are alternately arranged around the coolant concentrating portion 204. Thus, the long and short pins are regularly distributed within the frame 202.

Meanwhile, the unit 200 concentrates a coolant along spaces between the pins P1 and P2 using a capillary force. Thus, it is preferable that the distances between the pins P1 and P2 are narrow enough to generate the capillary force. Further, it is preferable that the capillary force is directed to the coolant concentrating portion 204. Thus, it is preferable that the distances between the pins P1 and P2 get narrower as directing to the coolant concentrating portion 204. However, the distances between the pins P1 and P2 may be uniform from the inside of the frame 202 to the coolant concentrating portion 204. Thus, it is preferable that dimensions of the plurality of pins are uniform, but may uniformly be changed. For example, the dimensions (thicknesses or widths) of the plurality of pins get reduced from the inside of the frame 202 to the coolant concentrating portion 204.

The first and second pins P1 and P2 may not be linear. For example, the first and second pins P1 and P2 may be wave-shaped or S-shaped. It is preferable that portions of the first and second pins P1 and P2 close to the coolant concentrating portion 204 are linear even when the first and second pins P1 and P2 are non-linear.

The geometry of the frame 202 may be square or other shapes, e.g., circular, elliptic, triangular, rhombic, pentagonal, or the like, as seen in FIG. 2 in phantom (showing circular frame). Even in this case, it is preferable that a region corresponding to the coolant concentrating portion 204 where the coolant is concentrated exists inside the frame 202 to cool a heat source. For example, the coolant concentrating portion 204 may be polygonal, such as triangular or square, not circular. In a case where the heat source has a predetermined length, the coolant concentrating portion 204 may be elliptic or slit-shaped with a length corresponding to the predetermined length. Also, considering that the heat source has a large area and a large amount of heat emitted from the entire surface thereof, the coolant concentrating portion 204 may be wider.

In a case where since the heat source is wider than the coolant concentrating portion 204, a portion of the heat source is positioned up to portions corresponding to lower portions of the first and second pins P1 and P2 around the coolant concentrating portion 204, the coolant starts absorbing heat from the heat source when the coolant flows into the coolant concentrating portion 204. Thus, the coolant concentrating portion 204 may not be wide. In a case where the heat source is wide, the coolant absorbs heat and is vaporized when flowing from the outside to the inside center of the coolant concentrating portion 204. Thus, when the heat generator is at a high temperature and generates a large amount of heat, the coolant does not reach the inside center of the coolant concentrating portion 204. As a result, the inside center of the coolant concentrating portion 204 may not be cooled. However, in a case where sharp vaporization does not occur and the coolant may reach the coolant concentrating portion 204, as described above, the coolant concentrating portion 204 may be enlarged than as shown in FIG. 2. This means that the lengths of the plurality of pins inside the frame 202 are shortened.

Another type of unit may be provided with a frame, external shape of which is square as shown in FIG. 2, but internal shape of which is not square and a plurality of pins which extend from the internal circumference of the frame to a region corresponding to the coolant concentrating portion 204 positioned inside the frame.

For example, another type of unit may be provided with a frame of an externally square shape, a circular region where the pins P1 and P2 are formed inside the frame (seen in phantom in FIG. 4), and the coolant concentrating portion 204 positioned inside the circular region. Here, it is preferable that the lengths of the pins in the circular region are selectively different, but may all be identical. Here, the pins may have various shapes as described above.

In the above-described another type of unit, a wide region, in which pins are inevitably not formed, exists between the circular region and the square frame. In this case, it is preferable that a coolant may flow into the wide region where the pins are not formed and then into a central region corresponding to the coolant concentrating portion 204. Thus, it is preferable that predetermined patterns are formed in the wide region so as to allow the coolant to smoothly flow into the central region. Here, the predetermined patterns may have various shapes within a range enough to guarantee smooth flow of the coolant. For example, the predetermined patterns may be rectangular parallelepipeds, cylinders, or the like with predetermined length and height so as to being oriented to the central region.

It is preferable that the unit 200 is formed of a material having a high conductivity. For example, it is preferable that the material of the unit 200 is copper.

First Embodiment

Figure 3:
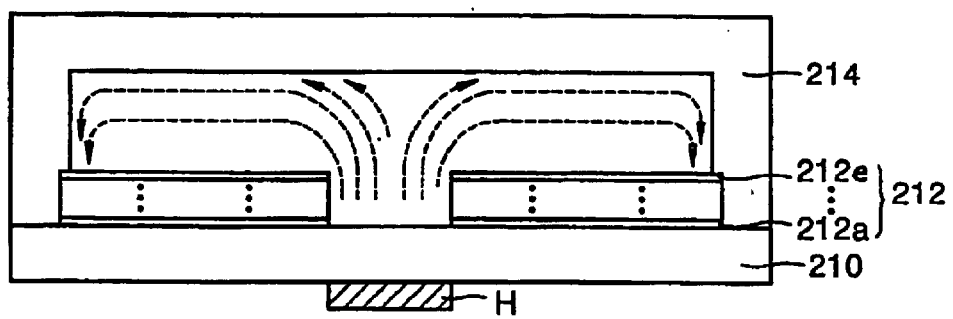
FIG. 3 is a cross-sectional view of the microcooling device according to the embodiment of the present invention, taken along a direction crossing a central region of a vaporizing portion.

Referring to FIG. 3, a microchannal array 212 formed from a stack of a plurality of units, such the unit as shown in FIG. 2, is provided on a substrate 210. For example, the microchannel array 212 includes first through fifth units 212a through 212e which are sequentially stacked so that coolant concentrating portions (See 204 of FIG. 2) coincide with each other. Thus, the microchannel array 212 may include the smaller number of units or the larger number of units.

A heat source H is attached to a predetermined region of the lower surface of the substrate 210. The heat source H may be one of elements constituting a semiconductor memory device which emits a relatively large amount of heat, e.g., a CPU. Since heat of the heat source H is transmitted to a coolant through the substrate 210, it is preferable that the substrate 210 is formed of a material having a high conductivity. The coolant concentrating portions 204 of the first through sixth units 212a through 212e constituting the microchannel array 212 correspond to the heat source H. Thus, the coolant flowing into the coolant concentrating portions 204 absorbs heat transmitted from the heat source H through the substrate 210. As a result, the coolant is vaporized, and vapor occurs in a central region of the microchannel array 212 corresponding to the coolant concentrating portion 204.

A cap 214 is provided on the substrate 210 around the microchannel array 212, i.e., the edge of the substrate 210, so as to cover the microchannel array 212. A protrusion of the cap 214 is formed so as to contact the fifth unit 212e of the microchannel array 212. The edge of the microchannel array 212 is fastened on the substrate 210 by receiving a downward force from the protrusion of the cap 214. The ceiling of the cap 214 is spaced apart from the microchannel array 212 so that the vapor rises up to the ceiling of the cap 214, is condensed with moving along the ceiling and sidewall of the cap 214, and flows back into the microchannel array 212. Dotted lines in FIG. 3 represent vapor generated from the central region of the microchannel array 212 and circulation paths of the vapor.

When the vapor reaches the ceiling of the cap 214, the vapor is condensed with adsorption of latent heat of the vapor into the cap 214. Liquid coolant drops are formed on the sidewall of the cap 214 by the condensation of the vapor and flow into the microchannel array 212 along the sidewall of the cap 214 by its weight when they become enlarged to predetermines sizes. The coolant which has flowed into the microchannel array 212 receives a capillary force, flows into the coolant concentrating portion 204 of the first unit 212a when reaching the first unit 212a, and undergoes the circulation process.

A heat sink (not shown), which absorbs heat from the cap 214 so as to maintain the cap 214 to a predetermined temperature, is mounted on the cap 214. Thus, heat is transmitted to the heat sink through the cap 214 with the bombardment of the vapor against the ceiling of the cap 214. As a result, the cap 214 is maintained at a uniform temperature enough to condense the vapor.

It is preferable that the upper surface of the substrate 210 is flat because the coolant flows into the upper surface of the substrate 210 opposite to the heat H of the substrate 210 by capillary forces of pins of the units on the substrate 210. However, the central region of the substrate 210 may be lower than the edge thereof. Thus, a portion of the upper surface between the edge and central region of the substrate 210 is slanted downward the central region. However, the edge of the upper surface of the substrate 210 to which the microchannel array 212 is attached and the central region are flat. Thus, a small step is formed between the edge and central region of the substrate 210. As a result, the coolant which has flowed into the microchannel array 212 receives capillary forces and gravity from the units, and thus slightly quickly flows into the coolant concentrating portion 204.

Figure 4:
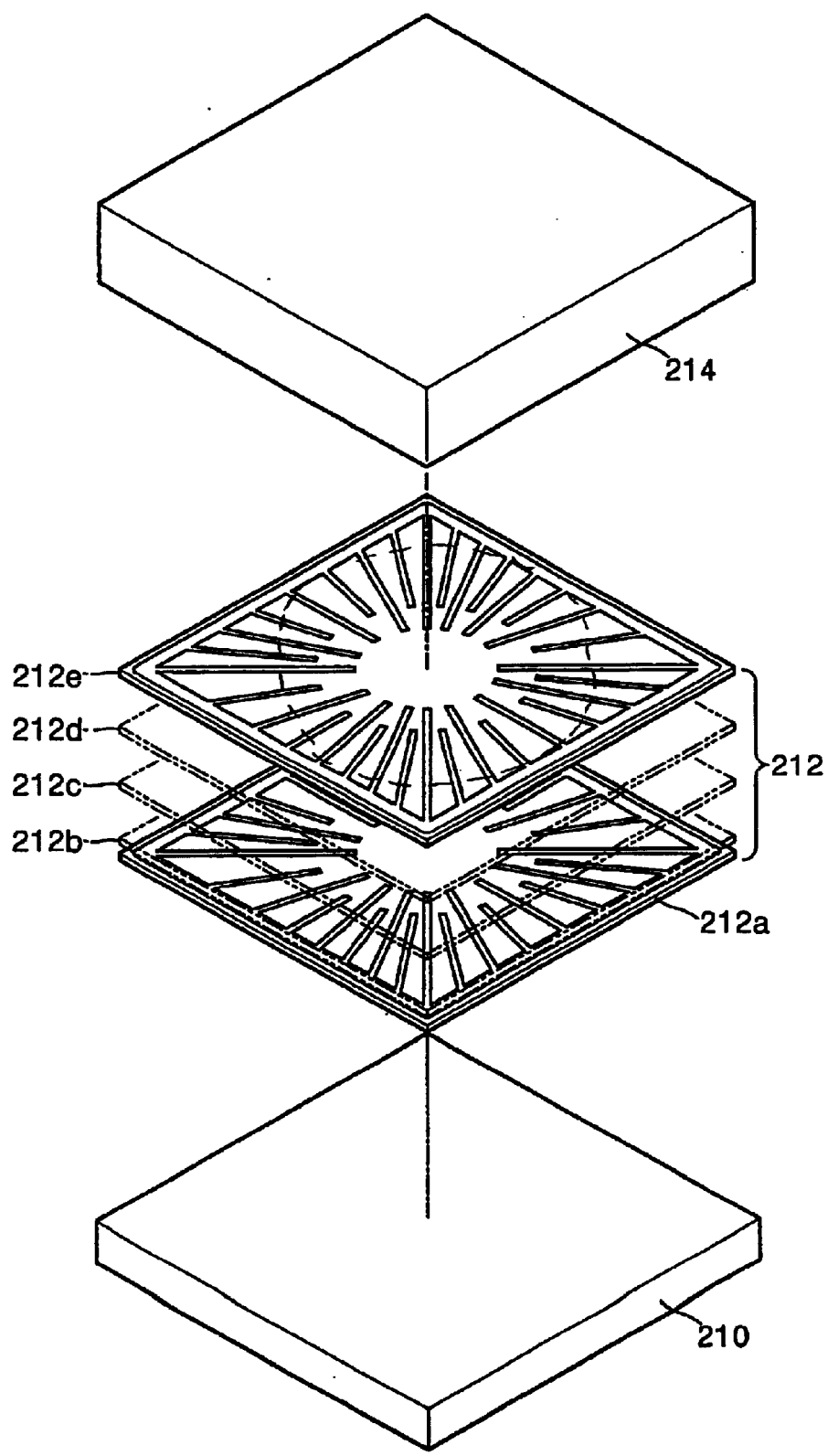
FIG. 4 is an exploded perspective view of the microcooling device shown in FIG. 3 according to the embodiment of the present invention.

FIG. 4 is an exploded perspective view of a vaporizer having the cross-section shown in FIG. 3. Referring to FIG. 4, a process of combining a substrate 210, a microchannel array 212, and a cap 214 can clearly be seen. It can be sent first through fifth units 212a through 212e constituting the microchannel array 212 have coolant concentrating portions, respectively, which coincide with each other.

Figure 7:
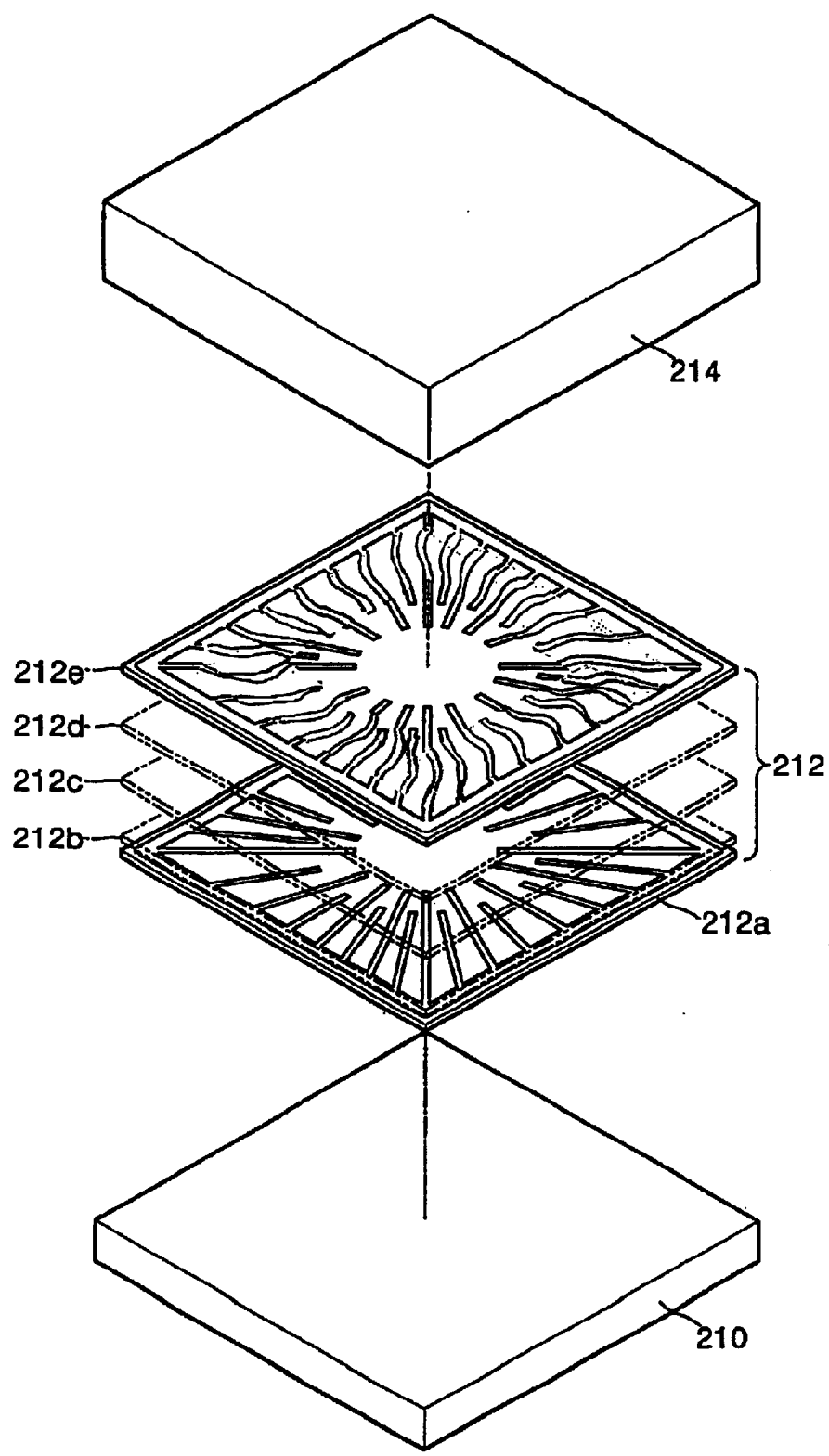
FIG. 7 is an exploded perspective view of a microcooling device according to yet another embodiment of the present invention.

It is preferable that the first through fifth units 212a through 212e constituting the microchannel array 212 have the same shapes, but may have different shapes. For example, the first unit 212a is a single unit as shown in FIG. 2, and any one selected from the second through fifth units 212b through 212e may be have non-linear pins as seen FIG. 7. Besides this, various combinations may be possible.

Figure 5:
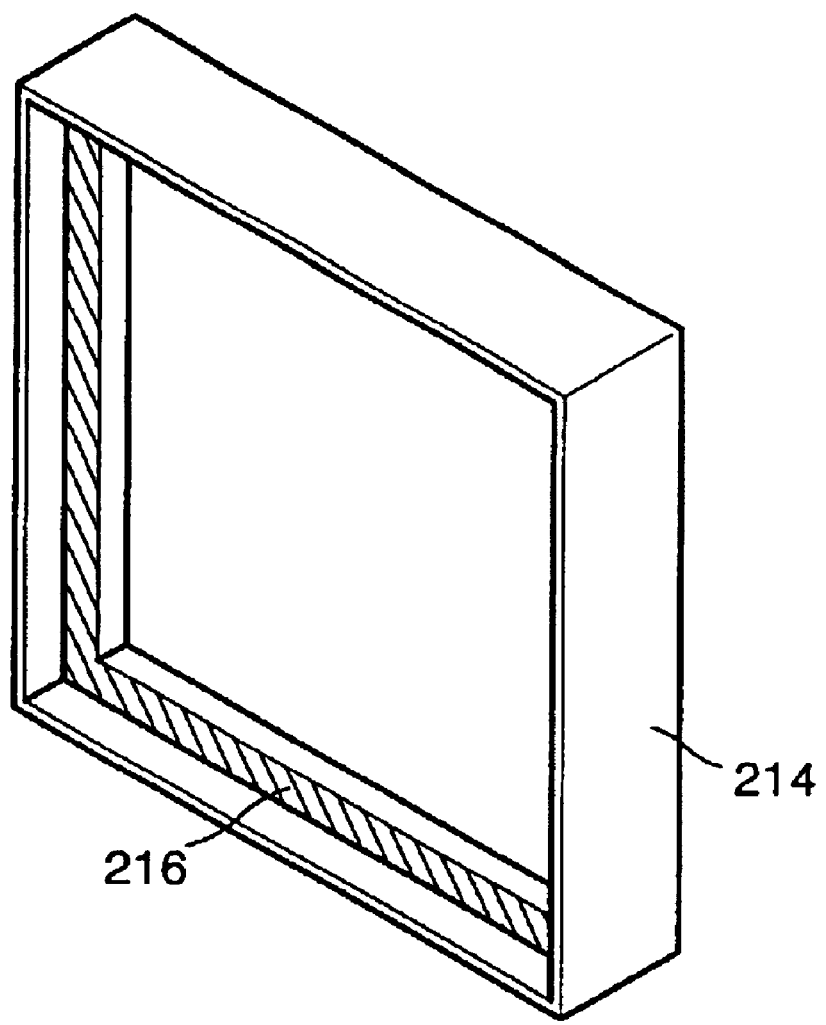
FIG. 5 is a perspective view of the inside of a cap 214 shown in FIG. 4.

FIG. 5 is a perspective view of the camp 214, the inside of which is oriented toward the microchannel array 212. Here, reference numeral 216 represents a protrusion which contacts the edge of the microchannel array 212 so as to apply a downward force to the microchannel array 212.

As describe above, the coolant is naturally circulated in the vaporizer of the heat exchanger according to the first embodiment of the present invention without pumping equipment. Thus, it is simple to configure and assemble the heat exchanger and manufacturing cost thereof is low.

Second Embodiment

In this embodiment, a plurality of units constituting a microchannel array are fastened on a substrate by pins.

Figure 6:
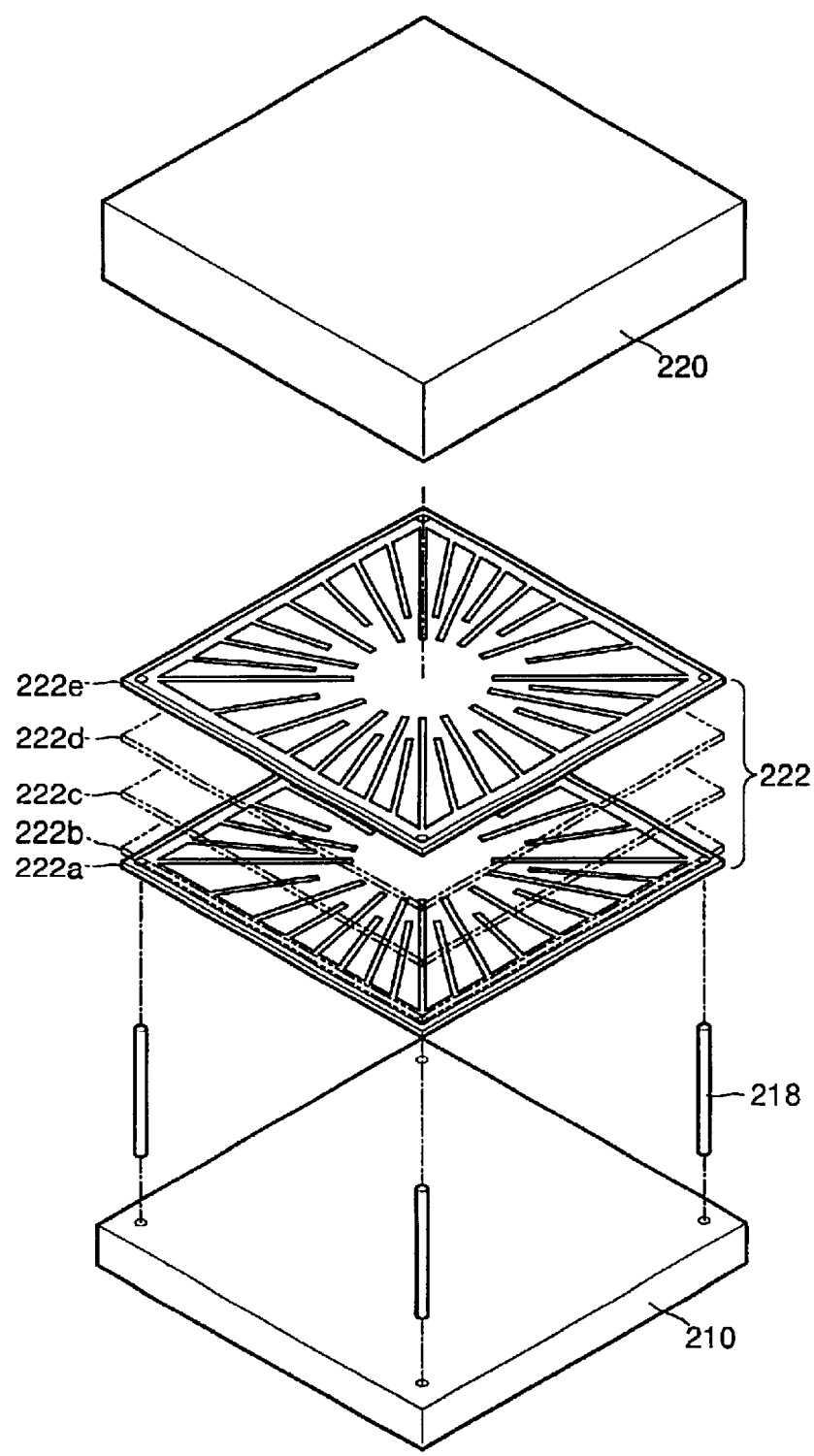
FIG. 6 is an exploded perspective view of a microcooling device according to another embodiment of the present invention.

Referring to FIG. 6, reference numeral 222 represents a microchannel array which is formed of a plurality of units 222a through 222e. It is preferable that the plurality of units 222a through 222e are the same as the first through fifth units 212a through 212e described in the first embodiment except that they have holes, into which a connection pin 218 is inserted, at their corners. However, a combination may be different in the configuration. The microchannel array 222, which is fastened on the substrate 210 by the connection pin 218, is covered with a cap 220. The cap 220 is hermetically sealed at the edge of the substrate around the microchannel array 220 so as to contact the side of the microchannel array 220. In other words, the cap 220 contacts the substrate so as to surrounds the side of the microchannel array 220. The cap 220 has the same shape, operation, and configuration as the cap described in the first embodiment (See 214 of FIG. 4) except that the cap 220 has no portion (See 216 of FIG. 5) which contacts the edge of the uppermost unit 222e of the microchannel array 222. As in the first embodiment, a heat sink (not shown) is also placed on the cap 220.

Many contents have been described. They must not be interpreted as being restricted to the scope of the present invention but as examples of the described preferred embodiments. For example, ordinary one in the art may form patterns of various shapes in order to allow a coolant to smoothly flow into a central region of a substrate opposite to the coolant concentrating portion 204 and increase the surface area of the central region that contacts the coolant if the coolant concentrating portion 204 of the unit 200 shown in FIG. 2 is wide. For example, hemispherical patterns or minute cylinders may be formed in the central region of the substrate. Also, the thickness of the central region of the substrate 210 may be thinner than thicknesses of other regions of the substrate 210 to increase heat conductivity from a heat source. Therefore, the scope of the present invention must be defined by the appended claims not the above-described embodiments.

As described above, units constituting a microchannel array in a microcooling device according to embodiments of the present invention include a frame and plurality of pins that are oriented toward the center. The units having the above-described structure may selectively be etched by photolithography used in a semiconductor manufacturing process. For example, since the units are manufactured by a chemical wet etching method, a manufacturing process thereof is simple and manufacturing cost thereof is low. Also, since the units are stacked to form the microchannel array, the microchannel array can have a very wide surface area, thereby increasing cooling efficiency. Further, inflow of a coolant is achieved by a capillary force to cool a heat source. Vapor generated during the cooling is condensed by a cap which covers the microchannel array, and the condensed vapor flows into the microchannel array by its load. Like this, since the coolant is naturally circulated, an additional pump is not necessary.

As a result, it is simple to configure and assemble the microcooling device.

What is claimed is:

1. A microcooling device comprising:
   a substrate, a predetermined region of a lower surface of which contacts a heat source;
   a microchannel array which is placed on the substrate so that a coolant concentrating portion is opposite to the predetermined region of the lower surface; and
   a condenser which fixes the microchannel array, condenses vapor generated in a process of cooling the heat source, and allows the condensed vapor to flow into the microchannel array.

2. The microcooling device of claim 1, wherein the microchannel array comprises at least one unit where a capillary force for allowing the coolant to flow into the coolant concentrating portion is generated.

3. The microcooling device of claim 2, wherein the microchannel array comprises at least two units which have the same shapes.

4. The microcooling device of claim 2, wherein the microchannel array comprises at least two or more units, at least one of the units having a different shape than another one of the units.

5. The microcooling device of claim 2, wherein the unit comprises a frame and a plurality of pins that are positioned inside the frame so as to being oriented to the coolant concentrating portion.

6. The microcooling device of claim 5, wherein some of the plurality of the pins have different lengths from other ones of the plurality of pins.

7. The microcooling device of claim 5, wherein the plurality pins are wave-shaped.

8. The microcooling device of claim 5, wherein the outer shape of the frame of the unit is circular, elliptic, or polygonal.

9. The microchannel device of claim 4, wherein any one of the units comprises a frame which has the same external shape as the other units and internal circular shape, and a plurality of pins which are positioned inside the frame and oriented toward the center.

10. The microcooling device of claim 9, wherein the external shape of the any one of the units is circular, elliptic, or polygonal.

11. The microcooling device of claim 9, wherein some of the plurality of the pins have different lengths from other ones of the plurality of pins.

12. The microcooling device of claim 9, wherein the plurality of pins are wave-shaped.

13. The microcooling device of claim 9, wherein predetermined patterns, which allow the coolant to smoothly flow into the center of the frame, are formed in a region of the frame.

14. The microcooling device of claim 13, wherein the predetermined patterns are rectangular parallelepipeds having predetermined lengths so as to be oriented toward the center of the frame and predetermined heights enough so as to allow the coolant to flow smoothly into the center.

15. The microcooling device of claim 1, wherein the condenser comprises:
   a cap which covers the microchannel array and is hermitically sealed at the edge of the of the substrate around the cap, and the inside of which contacts the vapor so as to absorb latent heat of the vapor; and
   a heat sink which is placed on the cap and absorbs heat transmitted to the cap so as to maintain a temperature of the cap to a predetermined temperature enough to condense the vapor.

16. The microcooling device of claim 3, wherein the unit comprises a frame and a plurality of pins that are positioned inside the frame so as to being oriented to the coolant concentrating portion.

17. The microcooling device of claim 4, wherein the unit comprises a frame and a plurality of pins that are positioned inside the frame so as to being oriented to the coolant concentrating portion.

* * * * *